US011562931B2

(12) United States Patent
Carta et al.

(10) Patent No.: US 11,562,931 B2
(45) Date of Patent: Jan. 24, 2023

(54) 3D STACKABLE BIDIRECTIONAL ACCESS DEVICE FOR MEMORY ARRAY

(71) Applicant: International Business Machines Corporation, Armonk, NY (US)

(72) Inventors: Fabio Carta, Pleasantville, NY (US); Matthew Joseph BrightSky, Armonk, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 17/350,014

(22) Filed: Jun. 17, 2021

(65) Prior Publication Data

US 2022/0406843 A1 Dec. 22, 2022

(51) Int. Cl.
*H01L 21/8234* (2006.01)
*H01L 27/24* (2006.01)
*H01L 21/02* (2006.01)
*H01L 29/786* (2006.01)
*H01L 29/66* (2006.01)
*H01L 29/417* (2006.01)
*H01L 29/423* (2006.01)

(52) U.S. Cl.
CPC ............ *H01L 21/823437* (2013.01); *H01L 21/02532* (2013.01); *H01L 21/02576* (2013.01); *H01L 21/02579* (2013.01); *H01L 21/02675* (2013.01); *H01L 21/823418* (2013.01); *H01L 27/2454* (2013.01); *H01L 29/41766* (2013.01); *H01L 29/42312* (2013.01); *H01L 29/6675* (2013.01); *H01L 29/78642* (2013.01); *H01L 29/78672* (2013.01); *H01L 29/78696* (2013.01)

(58) Field of Classification Search
CPC ......... H01L 21/02532; H01L 21/02576; H01L 21/02579; H01L 21/02675; H01L 21/8234; H01L 21/823412; H01L 21/823418; H01L 21/823437; H01L 21/823487; H01L 27/2436; H01L 27/2454; H01L 29/401; H01L 29/41725; H01L 29/41766; H01L 29/42312; H01L 29/6675; H01L 29/78642; H01L 29/78672; H01L 29/78696
See application file for complete search history.

(56) References Cited

U.S. PATENT DOCUMENTS

| 7,892,936 | B1 | 2/2011 | Wu et al. |
| 8,138,574 | B2 | 3/2012 | Chen et al. |
| 8,385,100 | B2 | 2/2013 | Kau et al. |
| 8,988,918 | B2 | 3/2015 | Franca-Neto |
| 10,374,103 | B1 | 8/2019 | Carta et al. |
| 2011/0084314 | A1* | 4/2011 | Or-Bach ............. H01L 27/0688 257/209 |
| 2013/0336053 | A1 | 12/2013 | Scoville et al. |

(Continued)

*Primary Examiner* — Cheung Lee
(74) *Attorney, Agent, or Firm* — Jeffrey M. Ingalls

(57) ABSTRACT

A method of manufacturing a vertical metal-semiconductor field-effect transistor (MESFET) device is provided. The method includes forming a first oxide layer, forming a first electrode in the oxide layer, forming a crystallized silicon layer on the first electrode, forming a second electrode on the first oxide layer and on sidewalls of the crystalized silicon layer, forming a second oxide layer on upper surfaces of the second electrode. The method also includes forming a third electrode on an upper surface of the crystallized silicon layer.

19 Claims, 9 Drawing Sheets

(56) References Cited

U.S. PATENT DOCUMENTS

2015/0200290 A1* 7/2015 Lai .................... H01L 29/407
                                              257/329
2018/0331284 A1   11/2018 BrightSky et al.
2019/0148453 A1   5/2019  Bruce et al.

* cited by examiner

3D STACKABLE BIDIRECTIONAL ACCESS DEVICE FOR MEMORY ARRAY

BACKGROUND

The present disclosure relates to three-dimensional (3D) stackable bidirectional access devices for memory arrays and methods of manufacturing the 3D stackable directional access devices. Back-end-of-line (BEOL) compatible access devices can enable a 3D memory array for both storage class memory and/or neuromorphic and cognitive computing. Ovonic threshold switches (OTS) are one possible access device that may be used in stackable 3D memory applications. It may be desirable to develop alternative solutions for stackable 3D memory applications.

SUMMARY

Embodiments of the present disclosure relate to a method of manufacturing a vertical metal-semiconductor field-effect transistor (MESFET) device. The method includes forming a first oxide layer, forming a first electrode in the oxide layer, forming a crystallized silicon layer on the first electrode, forming a second electrode on the first oxide layer and on sidewalls of the crystallized silicon layer, forming a second oxide layer on upper surfaces of the second electrode. The method also includes forming a third electrode on an upper surface of the crystallized silicon layer.

Other embodiments relate to a vertical MESFET device. The device includes a first oxide layer, a first electrode formed in the oxide layer, a crystallized silicon layer formed on the first electrode, a second electrode formed on the first oxide layer and on sidewalls of the crystalized silicon layer, a second oxide layer formed on upper surfaces of the second electrode. The device also includes a third electrode formed on an upper surface of the crystallized silicon layer.

Other embodiments relate to a memory device. The memory devices includes a bidirectional access device including a first oxide layer, a first electrode formed in the oxide layer, a crystallized silicon layer formed on the first electrode, a second electrode formed on the first oxide layer and on sidewalls of the crystalized silicon layer, a second oxide layer formed on upper surfaces of the second electrode, and a third electrode formed on an upper surface of the crystallized silicon layer. The memory device also includes a memory device connected to the bidirectional access device. Other embodiments relate to a method of manufacturing the memory device.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure. The drawings are only illustrative of certain embodiments and do not limit the disclosure.

DETAILED DESCRIPTION

Figure 1:
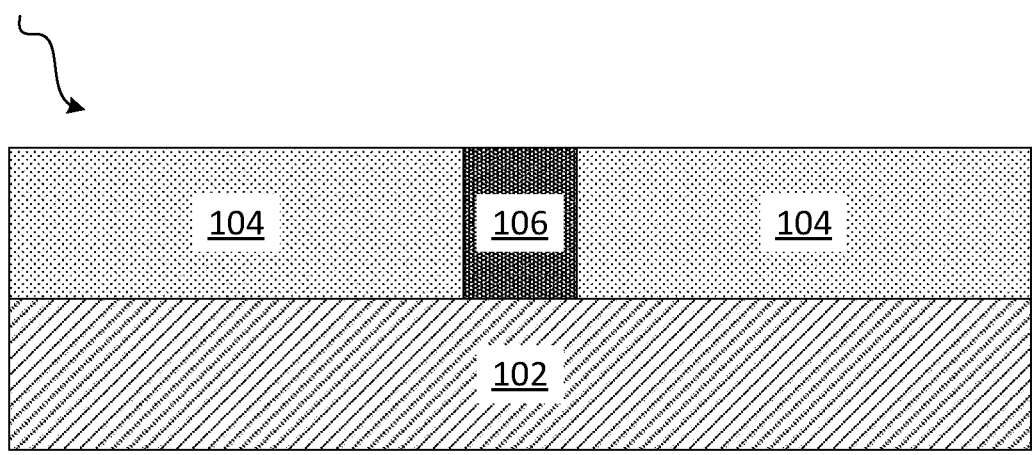
FIG. 1 is a cross-sectional view of a BEOL compatible semiconductor device for a memory array at an intermediate stage of the manufacturing process, according to embodiments.

As mentioned above, ovonic threshold switches (OTS) are presently studied as access devices for stackable 3D memory application. Certain of these OTS devices are two terminal devices which can be switched between the full ON state and the full OFF state by applying a voltage across the device. However, their snap-back behavior has a sharp turn on voltage, and as a result they can only write a memory cell in two states (i.e., either a SET level or a RESET level). The snap-back behavior may also make it difficult to control how much current is flowing through the device. Moreover, As and Se may be among the materials that are included in the OTS device elements, and As and Se may not desirable materials to use in the fabrication process. In addition, OTS devices may be difficult to pattern, they may be sensitive to reactive ion etching (RIE), and may damage the devices during the patterning steps. This may result in a decrease yield of the OTS devices.

Another possible access device for stackable 3D memory applications may be recrystallized Si diodes, which are also two terminal access devices. These recrystallized Si diode type access devices may address some of the drawbacks of the OTS type devices. For example, the recrystallized Si diodes may be less sensitive to RIE sensitivity, the devices may have a reduced As content relative to OTS devices, and there may be a lack of snap-back behavior possibly enabling setting the memory to different states (although the IV (current/voltage) characteristic is still exponential)). A diode has a simple structure, a small footprint and is capable of providing high drive currents. Compared to an Ovonic Threshold Switch (OTS), a diode benefits from established device physics/fabrication technology, better reliability, and high-temperature stability. However, given that a diode is a minority carrier device, its OFF characteristics may be more sensitive to grain boundary dislocations than a majority carrier device such as a field effect transistor. In addition, the presence of grain boundaries may induce device-to-device non-uniformity in the ON characteristics of the diode. Moreover, the IV characteristics of a recrystallized silicon diode may be exponential, which may require very tight control over the current level as a multistate memory functionality is desired. Thus, it may be desirable to find alternative solutions for three-dimensional stackable bidirectional access devices for memory arrays.

The present disclosure describes three-dimensional (3D) stackable bidirectional access devices for memory arrays and methods of manufacturing the 3D stackable directional access devices. In particular, the present disclosure describes back-end-of-line (BEOL) compatible 3D stackable bidirectional access devices that integrate a crystallized metal-semiconductor field-effect transistor (MESFET) device in the BEOL. In general, to be compatible with FEOL or BEOL processes means that the formation/processing of the access device should not destroy the high performance transistors that are formed into the FEOL/BEOL. According to embodiments, these access devices may offer bi-directional behavior and can be fabricated compatible with BEOL processes which makes them 3D stackable and usable with both PCM and RRAM memories. A third terminal of the access device may offer better control over the current level, thus allowing for multiple bit selection. Therefore, according to present embodiments, these access devices may allow for a significant increase of the bit density of a memory array.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit ("IC") fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping, and patterning/lithography.

Deposition is any process that grows, coats, or otherwise transfers a material onto the wafer. Available technologies include physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma-enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etching processes (either wet or dry), chemical-mechanical planarization ("CMP"), and the like. One example of a removal process is ion beam etching ("IBE"). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching ("RIE"). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation.

These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light-sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of memory technologies that are more specifically relevant to aspects of the present disclosure, embedded DRAM ("eDRAM") is a dynamic random-access memory ("DRAM") integrated on the same die or multi-chip module ("MCM") of an application-specific integrated circuit ("ASIC") or microprocessor. eDRAM has been implemented in silicon-on-insulator ("SOI") technology, which refers to the use of a layered silicon—insulator—silicon substrate in place of conventional silicon substrates in semiconductor manufacturing. eDRAM technology has met with varying degrees of success, and demand for SOI technology as a server memory option has decreased in recent years.

Magnetoresistive random-access memory ("MRAM") devices using magnetic tunnel junctions ("MTJ") are one option to replace existing eDRAM technologies. MRAM is a non-volatile memory, and this benefit is a driving factor that is accelerating the development of this memory technology. Current MRAM MTJ structures are relatively slow, and the only way to reach MTJ write target speeds comparable to eDRAM (~5 ns) is with double magnetic tunnel junctions ("DMTJ").

Phase-change memory (also known as PCM, PCME, PRAM, PCRAM, OUM (ovonic unified memory) and C-RAM or CRAM (chalcogenide RAM)) is a type of non-volatile random-access memory. PMCs exploit the unique behavior of chalcogenide glass. Phase change materials, such as chalcogenides, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

Phase change materials in PCM devices are capable of being switched between a first structural state in which the material is in a generally amorphous solid phase, and a second structural state in which the material is in a generally crystalline solid phase in the active region of the cell. The term "amorphous" is used to refer to a relatively less ordered structure, more disordered than a single crystal, which has the detectable characteristics such as higher electrical resistivity than the crystalline phase. The term "crystalline" is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material can be switched into either different solid phases or mixtures of two or more solid phases, providing a gray scale between completely amorphous and completely crystalline states.

The change from the amorphous to the crystalline state in PCM devices is generally a lower current operation, requiring a current that is sufficient to raise the phase change material to a level between a phase transition temperature and a melting temperature. The change from crystalline to amorphous, referred to as "reset," is generally a higher current operation, which includes a short high current density pulse to melt or break down the crystalline structure, after which the phase change material cools quickly, quenching the phase change process, thus allowing at least a portion of the phase change structure to stabilize in the amorphous state. It is desirable to minimize the magnitude of the reset current used to cause transition of phase change material from a crystalline state to an amorphous state. The magnitude of the needed reset current can be reduced by reducing the volume of the active region in the phase change material element in the cell.

Embodiments in accordance with the present disclosure provide methods and devices for employing three-dimensional (3D) stackable bidirectional access devices in combination with PCM based memory devices.

Resistive random access memory (RRAM) structures can be used as a type of non-volatile (NV) random-access memory (RAM) in computing resources. RRAM devices having a simple metal-insulator-metal structure show promising characteristics in terms of scalability, low power operation, and multilevel data storage capability, and they may be suitable for next-generation memory applications. RRAM typically operates by controlled changes in resistance across a dielectric solid-state material. The dielectric solid-state material may be referred to as a memristor. RRAM may be considered as a promising technology for electronic synapse devices (or memristors) for neuromorphic computing as well as high-density and high-speed non-volatile memory applications. In neuromorphic computing applications, a resistive memory device can be used as a connection (synapse) between a pre-neuron and post-neuron, representing the connection weight in the form of device resistance. Multiple pre-neurons and post-neurons can be connected through a crossbar array of RRAM s, which may enable a fully-connected neural network. Oxygen vacancies in a metal oxide layer of a RRAM device are the building blocks of a current conducting filament.

In neuromorphic computing applications, a resistive memory device (e.g., a RRAM device) can be used as a connection (synapse) between a pre-neuron and post-neuron, representing the connection weight in the form of device resistance. Multiple pre-neurons and post-neurons can be connected through a crossbar array of RRAMs, which naturally expresses a fully-connected neural network. A crossbar array of RRAM can be made with junction with resistively switching material formed on the bottom electrodes. The top electrodes are formed on the junction with resistively switching material to form a crossbar array of RRAMs. Non-volatile resistively switching metal oxides, such as HfOx, TaOx, AlOx, ZrOx, TiOx, or a combination of these materials are integrated into nano-crossbar arrays and nano-cross-points scaled down to a feature size by electron beam lithography. This enables a fast fabrication route for high density prototype test structures of passive memory cores with two terminal devices. The structures and the integrated material is electrically characterized to gain an insight into the general properties of nano-crossbar arrays with resistively switching metal oxides and to define the demands for an external CMOS control system.

Nonvolatile and resistively switching materials with two or more stable states such as HfOx are integrated as two terminal memory devices to efficiently create a RRAM bit pattern. These cells can be integrated into crossbar arrays where it reduces the cell size per bit to four. The switching material can cover the whole chip area and every junction at a cross point is an addressable cell of a RRAM. Since the array consists of passive elements, additional active external circuitry is required for the operation to address the cells, set, and reset their state and read the stored information.

Embodiments in accordance with the present disclosure provide methods and devices for employing three-dimensional (3D) stackable bidirectional access devices in combination with RRAM based memory devices.

In certain embodiments, the memory access device is configured as a metal-semiconductor field-effect transistor (MESFET). In general, a MESFET is a field-effect transistor semiconductor device similar to a junction-gate field-effect transistor (JFET) with a Schottky (metal-semiconductor) junction instead of a p-n junction for a gate. Thus, the MESFET has a metal contact formed directly onto the silicon (or polycrystalline silicon), and this forms a Schottky barrier diode junction. As such, the Schottky diode is used as a reverse biased diode in the same was that a JFET does. However, the Schottky diode may form a smaller diode than the JFET.

Referring now to the drawings in which like numerals represent the same or similar elements and initially to FIG. 1, an exemplary method of manufacturing a three-dimensional (3D) stackable bidirectional access devices to which the present embodiments may be applied is shown. As shown in FIG. 1, several back end of line ("BEOL") and front end of line (FEOL) layers (FEOL/BEOL layers 102) are formed.

In general, the front-end-of-line (FEOL) is the first portion of IC fabrication where the individual devices (transistors, capacitors, resistors, etc.) are patterned in the semiconductor. FEOL generally covers everything up to (but not including) the deposition of metal interconnect layers.

In general, the BEOL is the second portion of IC fabrication where the individual devices (transistors, capacitors, resistors, etc.) are interconnected with wiring on the wafer. The BEOL metal layers (not shown) can include, for example, Cu, TaN, Ta, Ti, TiN or a combination thereof. A BEOL dielectric layer (not shown) may be formed on the sides of one or more of the BEOL metal layers. The BEOL dielectric layer may be composed of, for example, $SiO_x$, $SiN_x$, SiBCN, low-κ, NBLOK, or any other suitable dielectric material. The structure including the FEOL/BEOL layers 102 shown in FIG. 1 is a starting structure upon which the three-dimensional (3D) stackable bidirectional access devices of the present embodiments are to be formed. It should be appreciated that any suitable number or combination of FEOL/BEOL layers may be contemplated with respect to the three-dimensional (3D) stackable bidirectional access devices of the present embodiments.

As shown in FIG. 1, a first oxide layer 104 is provided on the FEOL/BEOL layers 102. The first oxide layer 104 can include any materials known in the art, such as, for example, porous silicates, carbon doped oxides, silicon dioxides, silicon nitrides, silicon oxynitrides, or other dielectric materials. In certain examples, the material of the first oxide layer 104 are $SiO_2$ or SiN. In certain examples, the materials of the first oxide layer 104 are materials that may be formed at or below 400° C. so as to not damage any BEOL layer components. The first oxide layer 104 can be formed using any method known in the art, such as, for example, chemical vapor deposition, plasma enhanced chemical vapor deposition, atomic layer deposition, or physical vapor deposition. The first oxide layer 104 can have a thickness ranging from about 25 nm to about 200 nm, for example. However, it should be appreciated that the first oxide layer 104 may be formed to any suitable thickness, and may include materials other than those listed above. The first oxide layer 104 is then patterned, and a bottom electrode 106 is formed in the first oxide layer 102. The bottom electrode 106 may serve as a first terminal (or source) of the MESFET memory access device of the semiconductor device 100.

Figure 2:
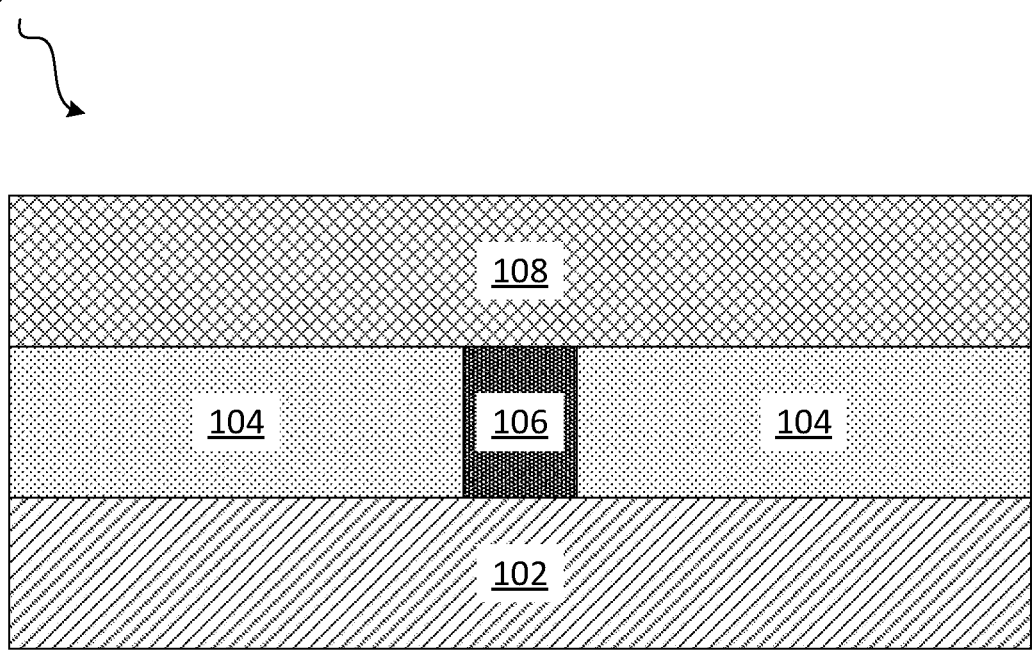
FIG. 2 is a cross-sectional view of the semiconductor device of FIG. 1 after additional fabrication operations, according to embodiments.

Referring now to FIG. 2, this figure is a cross-sectional view of the semiconductor device 100 of FIG. 1 after additional fabrication operations, according to embodiments. As shown in FIG. 2, a silicon layer 108 is blanket deposited on the first oxide layer 104 and the bottom electrode 106. The silicon layer 108 may be, for example, about 50-100 nm thick. However, it should be appreciated that any other suitable thickness of the silicon layer 108 may be used. The silicon layer 108 may be formed by any suitable material deposition technique such as, for example, physical vapor deposition (PVD) or plasma-enhanced chemical vapor deposition (PECVD). In certain embodiments, the silicon layer 108 may be doped with, for example, arsenic (As), antimony (Sb), boron (B), phosphorus (P), or any suitable combination of these elements. It should be appreciated that other suitable dopants may also be used in the formation of the silicon layer 108. It should also be appreciated that in other examples, the silicon layer 108 may not be doped.

Figure 3:
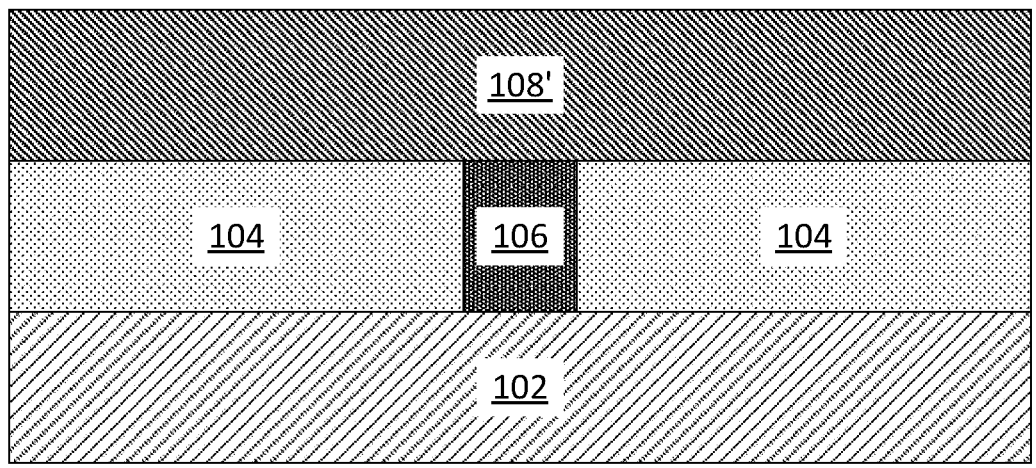
FIG. 3 is a cross-sectional view of the semiconductor device of FIG. 2 after additional fabrication operations, according to embodiments.

Referring now to FIG. 3, this figure is a cross-sectional view of the memory access device of FIG. 2 after additional fabrication operations, according to embodiments. As shown in FIG. 3 (i.e., indicated by the change in the cross-hatching pattern), the silicon layer 108 of FIG. 2 is subjected to a laser annealing process to convert the relatively amorphous silicon layer 108 of FIG. 2 into a polycrystalline silicon layer 108'. In certain embodiments, it may be desirable to perform the laser annealing process to achieve a large crystal grain size for the polycrystalline silicon layer 108'. In examples where dopants are used in the silicon layer 108, the laser annealing process associated with FIG. 3 also activates the dopants in the annealed polycrystalline silicon layer 108'.

Figure 4:
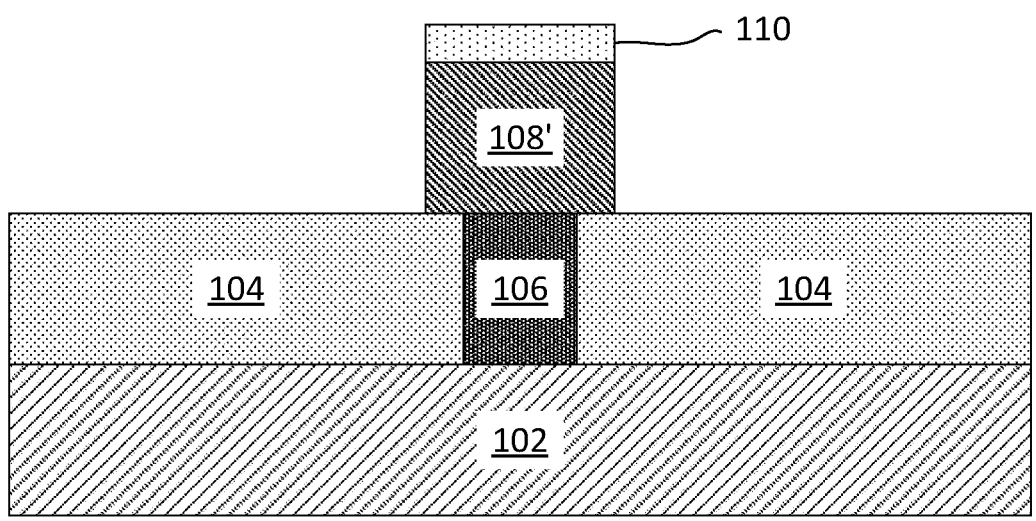
FIG. 4 is a cross-sectional view of the semiconductor device of FIG. 3 after additional fabrication operations, according to embodiments.

Referring now to FIG. 4, this figure is a cross-sectional view of the memory access device of FIG. 3 after additional fabrication operations, according to embodiments. As shown in FIG. 4, the polycrystalline silicon layer 108' is patterned with the use of a hardmask 110. In certain examples, the width of the patterned polycrystalline silicon layer 108' is wider than a width of the underlying bottom electrode 106 to prevent short circuiting of second terminal (see e.g., the gate electrode 112 of FIG. 5) with the bottom electrode 106. In this regard, there is a certain amount of the oxide layer 104 that separates the bottom electrode from the gate electrode to minimize the possible of a short. It should be appreciated that the polycrystalline silicon layer 108' may be produced by any suitable combination of lithography, material deposition and material removal process known to one of skill in the art.

Figure 5:
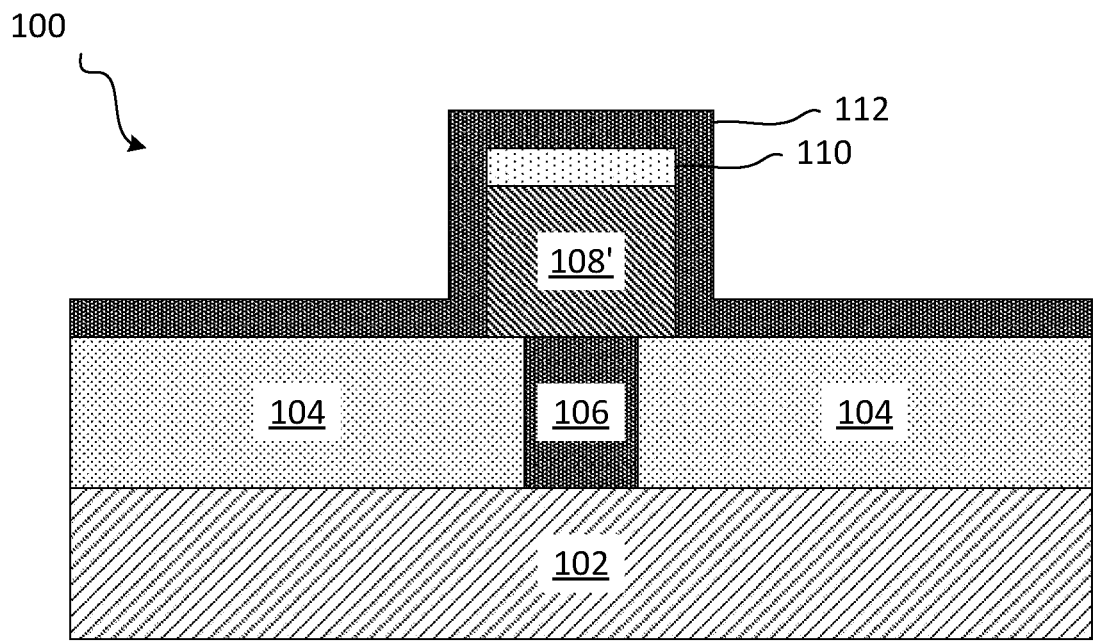
FIG. 5 is a cross-sectional view of the semiconductor device of FIG. 4 after additional fabrication operations, according to embodiments.

Referring now to FIG. 5, this figure is a cross-sectional view of the semiconductor device 100 of FIG. 4 after additional fabrication operations, according to embodiments. As shown in FIG. 5, a gate electrode 112 is conformally deposited over the entire wafer surface. As such, the gate electrode 112 is at least initially formed on the first oxide layer 104, the sidewalls of the polycrystalline silicon layer 108' and the top surface of the hardmask 110. In certain examples, the hardmask 110 may be removed prior to the formation of the gate electrode 112. The conformal gate electrode 112 may be formed to, for example, a thickness of about 20 nm. However, it should be appreciated that any other suitable thickness of the gate electrode 112 may be utilized. The gate electrode 112 may be formed of a metal (e.g., tungsten (W) or any other suitable conductive metal). The gate electrode 112 film is then patterned so that the gate electrode 112 is connected to a single row of memory access devices 100. The gate electrode 112 is a second terminal (or gate) of the three terminal MESFET memory access device 100.

Figure 6:
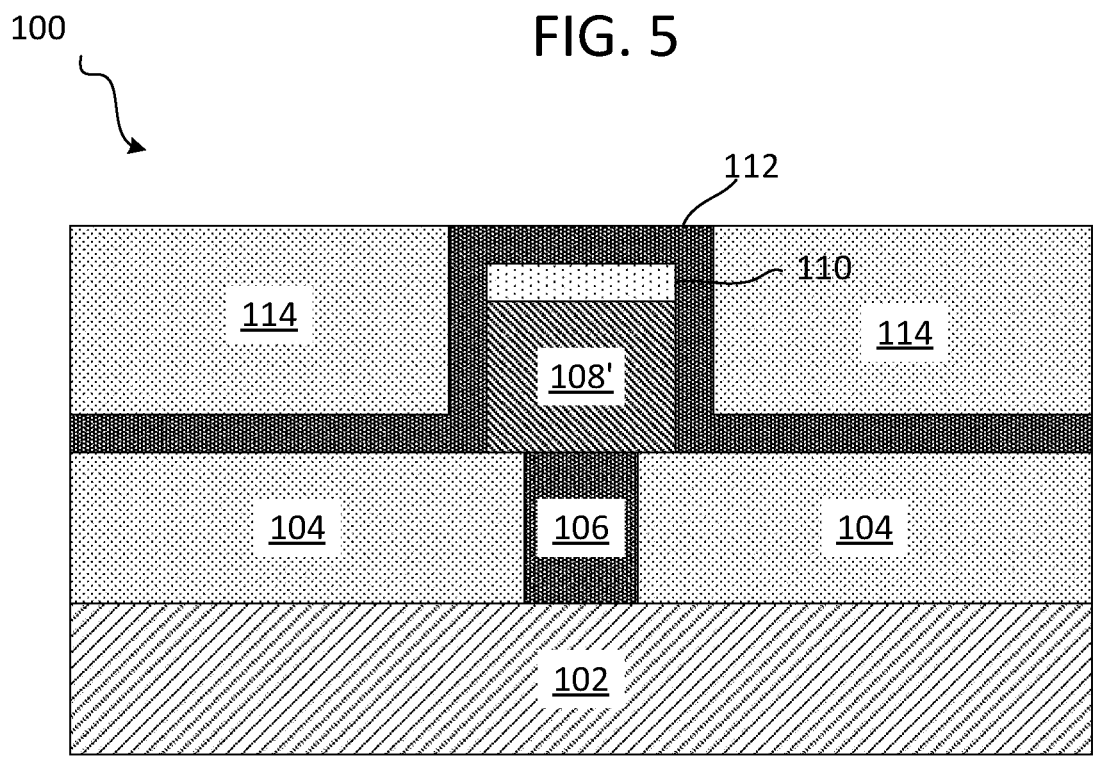
FIG. 6 is a cross-sectional view of the semiconductor device of FIG. 5 after additional fabrication operations, according to embodiments.

Referring now to FIG. 6, this figure is a cross-sectional view of the semiconductor device 100 of FIG. 5 after additional fabrication operations, according to embodiments. As shown in FIG. 6, a second oxide layer 114 is formed over the previously patterned gate electrode 112. The second oxide layer 114 can include any materials known in the art, such as, for example, porous silicates, carbon doped oxides, silicon dioxides, silicon nitrides, silicon oxynitrides, or other dielectric materials. The second oxide layer 114 can be formed using any method known in the art, such as, for example, chemical vapor deposition, plasma enhanced chemical vapor deposition, atomic layer deposition, or physical vapor deposition. The second oxide layer 114 can have a thickness ranging from about 25 nm to about 200 nm, for example. However, it should be appreciated that, in certain examples, the second oxide layer 104 is formed to any suitable thickness (provided that it is at least thick enough so that the upper surface of the second oxide layer 104 is as high as the upper surface of the polycrystalline silicon layer 108'), and may include materials other than those listed above.

Figure 7:
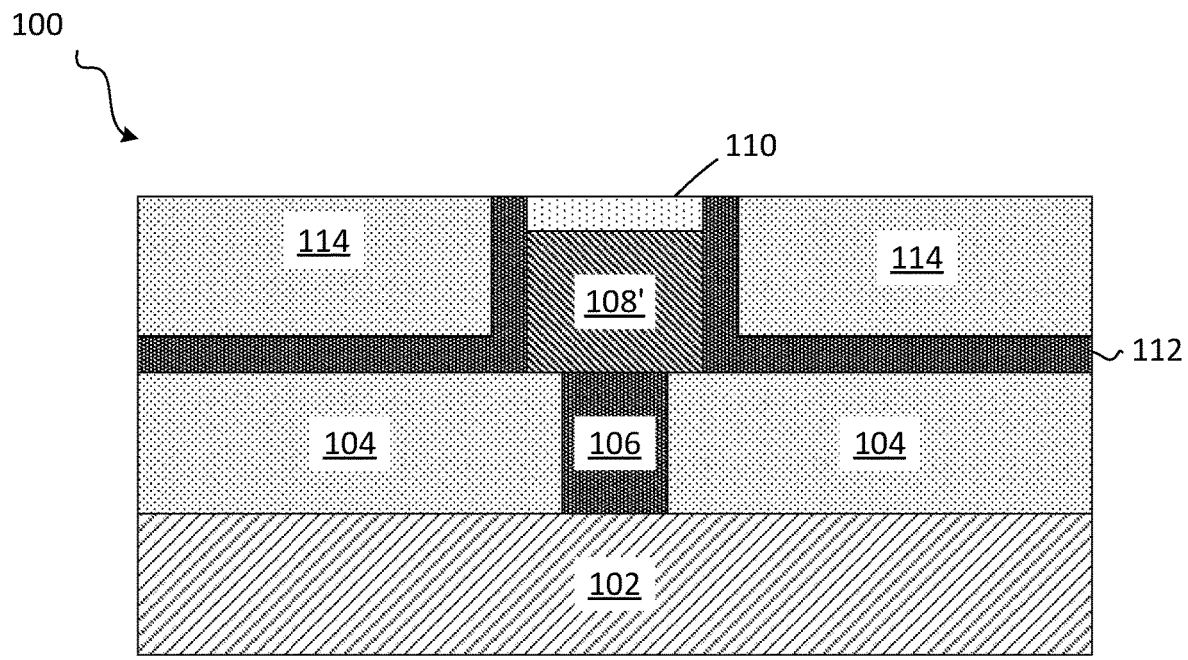
FIG. 7 is a cross-sectional view of the semiconductor device of FIG. 6 after additional fabrication operations, according to embodiments.

Referring now to FIG. 7, this figure is a cross-sectional view of the semiconductor device 100 of FIG. 6 after additional fabrication operations, according to embodiments. As shown in FIG. 7, the semiconductor device 100 is subjected to a planarization technique (e.g., CMP) to planarize the upper surface thereof and remove an upper portion of the gate electrode 112 above the hardmask 110. This will enable the sidewalls (or vertical portions) of the gate electrode 112 to be recessed in a subsequent processing operation.

Figure 8:
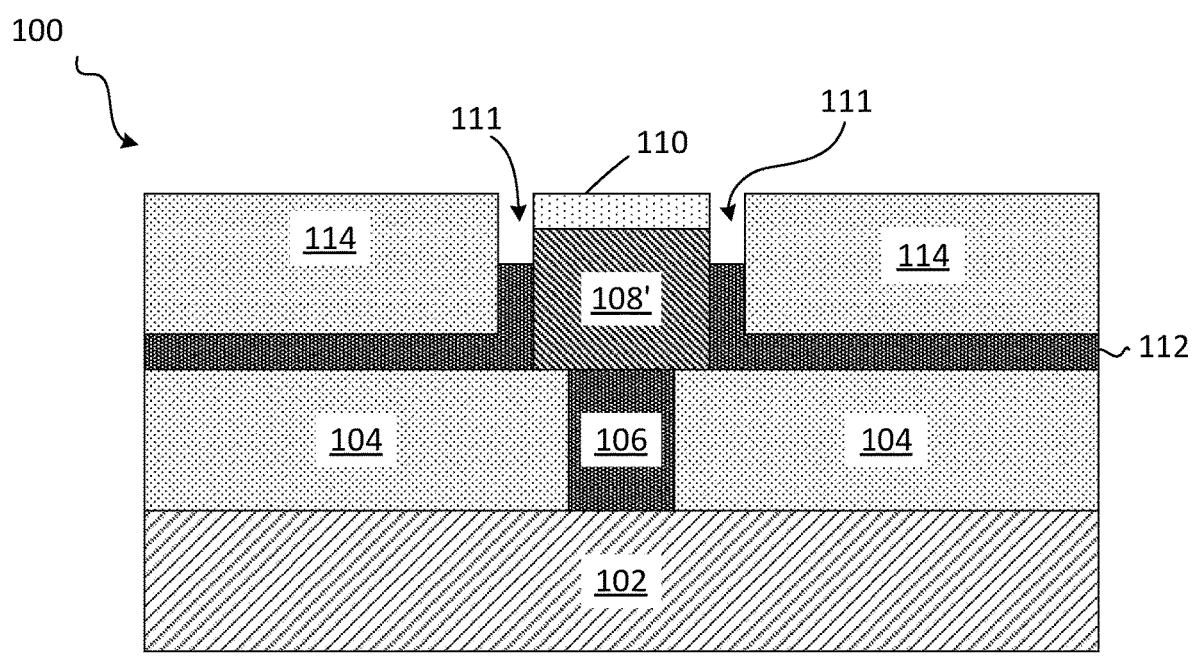
FIG. 8 is a cross-sectional view of the semiconductor device of FIG. 7 after additional fabrication operations, according to embodiments.

Referring now to FIG. 8, this figure is a cross-sectional view of the semiconductor device 100 of FIG. 7 after additional fabrication operations, according to embodiments. As shown in FIG. 8, a material removal process (e.g., etching) is performed on the semiconductor device 100 to recess the sidewalls (i.e., vertical portions) of the gate electrode 112 to a level that is below an upper surface of the polycrystalline silicon layer 108'. Thus, recesses 111 are formed in the gate electrode 112 region between the second oxide layer 114, the polycrystalline silicon layer 108' and the hardmask 110.

Figure 9:
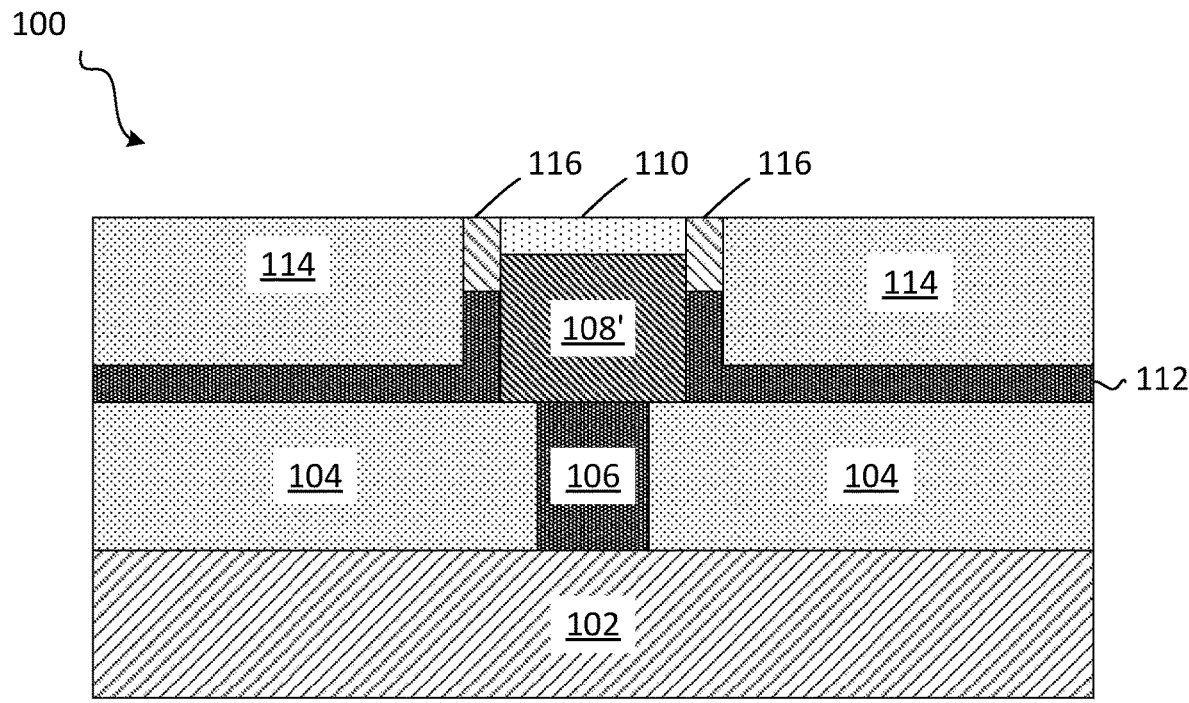
FIG. 9 is a cross-sectional view of the semiconductor device of FIG. 8 after additional fabrication operations, according to embodiments.

Referring now to FIG. 9, this figure is a cross-sectional view of the semiconductor device 100 of FIG. 8 after additional fabrication operations, according to embodiments. As shown in FIG. 9, after the recesses 111 are formed, a dielectric layer 116 is deposited to fill the recesses 111. In certain examples, the dielectric layer 116 is formed at least up to a height of an upper surface of the second oxide layer 114.

Figure 10:
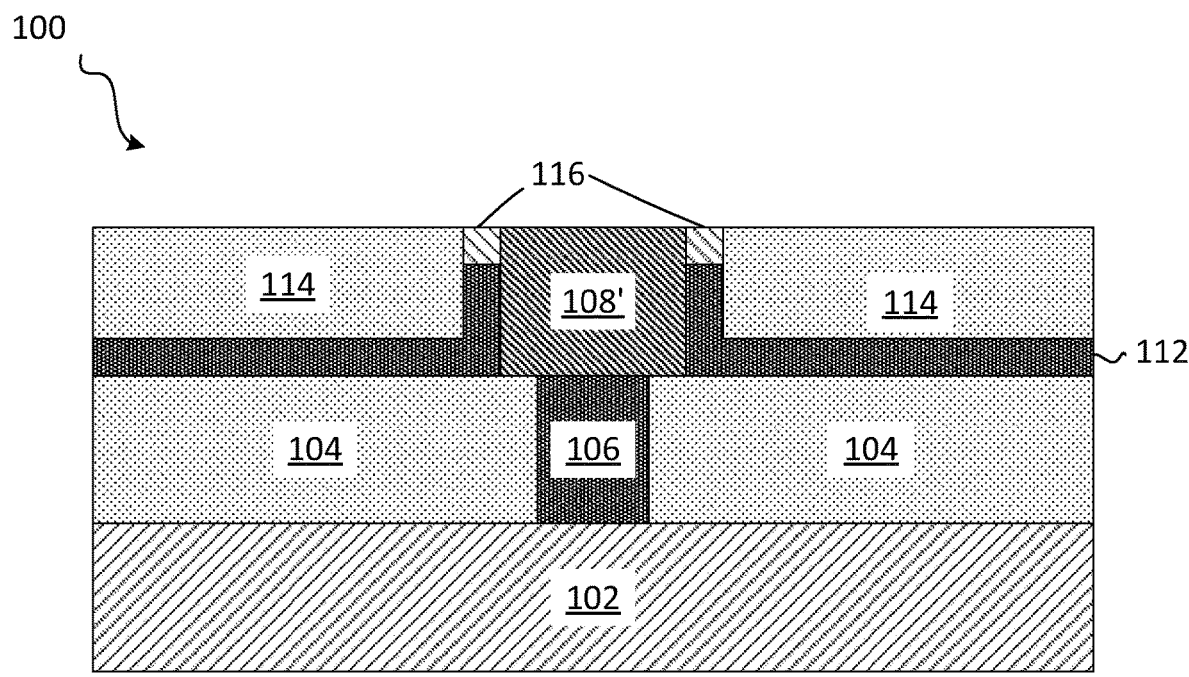
FIG. 10 is a cross-sectional view of the semiconductor device of FIG. 9 after additional fabrication operations, according to embodiments.

Referring now to FIG. 10, this figure is a cross-sectional view of the semiconductor device 100 of FIG. 9 after additional fabrication operations, according to embodiments. As shown in FIG. 10, in certain embodiments, a material removal process (e.g., CMP) is performed to once again planarize the upper surface of the semiconductor device 100, and to remove the hardmask 110 so that the upper surface of the polycrystalline silicon layer 108' is exposed.

Figure 11:
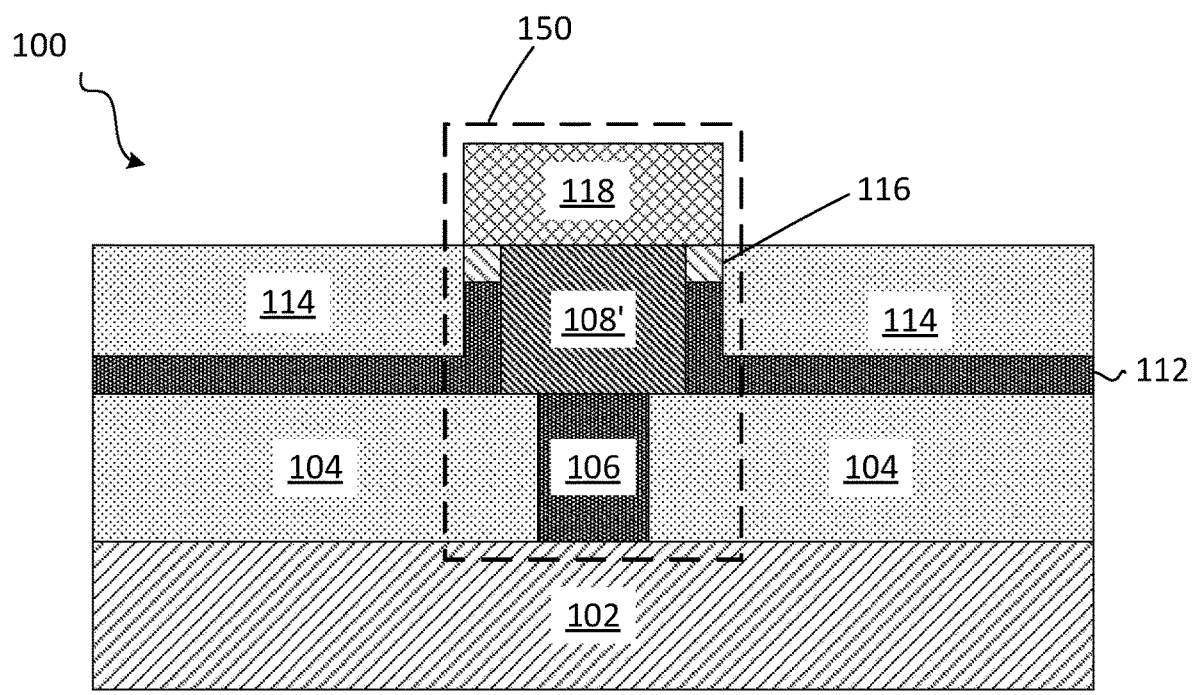
FIG. 11 is a cross-sectional view of the semiconductor device of FIG. 10 after additional fabrication operations, according to embodiments.

Referring now to FIG. 11, this figure is a cross-sectional view of the semiconductor device 100 of FIG. 10 after additional fabrication operations, according to embodiments. As shown in FIG. 11, a top electrode 118 is formed over the dielectric layer and the polycrystalline silicon layer 108'. With regard to the three terminals structure of this memory access structure of the semiconductor device 100, a first terminal may be the source (e.g., the bottom electrode 106), the second terminal may be the gate electrode 112, and the third terminal may be drain (e.g., the top electrode 118). It should be appreciated that the formation of the dielectric layer 116 in the recesses 111 functions as an insulating layer that prevents electrical short circuiting between the gate electrode 112 and the top electrode 118. It should be appreciated that the material of the dielectric layer 116 may be the same material as that of the second oxide layer 114 or a different material(s). Thus, in certain embodiments, a vertically oriented MESFET type memory access device 150 is formed, the general boundaries of which are indicated the heavy dashed lines in FIG. 11. Therefore, the embodiments described herein achieve a structure and method of integrating a crystallized Si MESFET device (i.e., MESFET type memory access device 150) in the BEOL. These MESFET type memory access devices 150 enable a bi-directional behavior, and they can be fabricated in compatible processes with the BEOL processes. This makes the MESFET type memory access device 150 3D stackable and usable with both PCM and RRAM memories.

Moreover, the third terminal of the device (e.g., the gate electrode 112) offers better control over the current level allowing for multiple bit selection, which may significantly increase the bit density of a memory array.

Figure 12A:
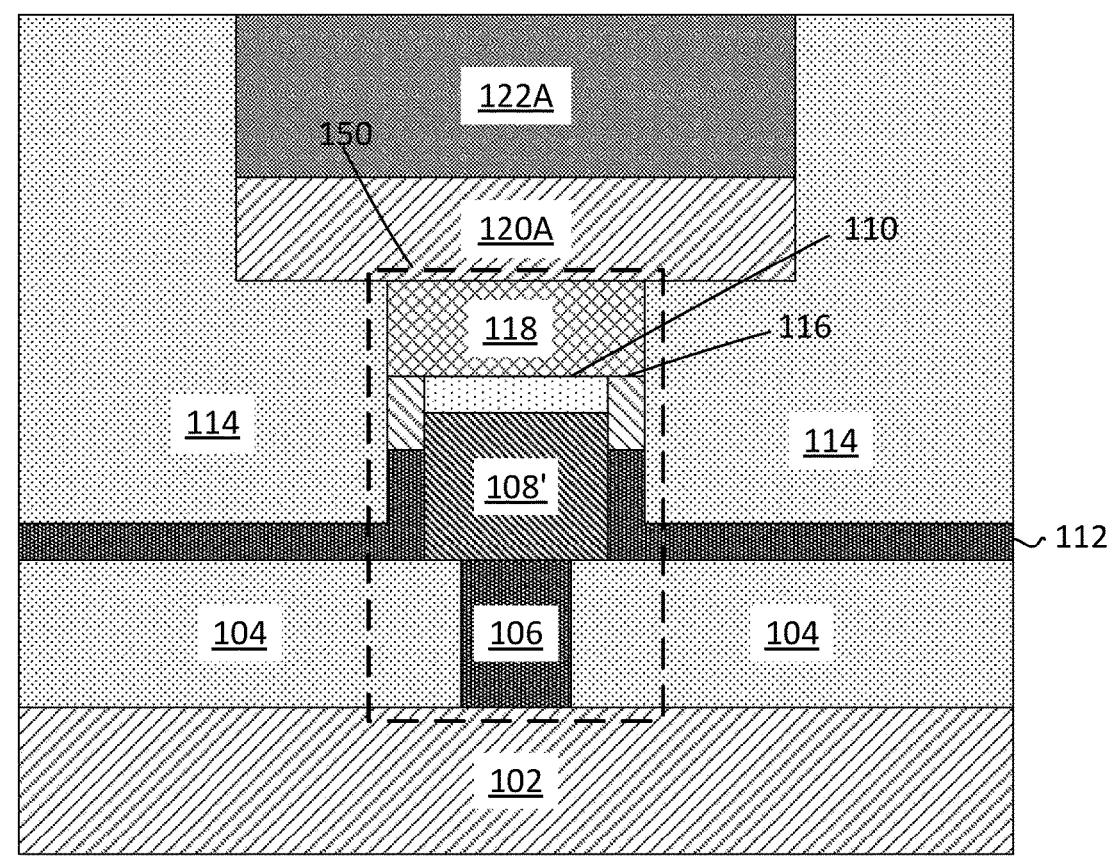
FIG. 12A is a cross-sectional view of the semiconductor device of FIG. 11 in combination with a mushroom cell type memory device, according to embodiments.

Referring now to FIG. 12A, this figure is a cross-sectional view of the semiconductor device 100 of FIG. 11 in combination with a mushroom cell type memory device, according to embodiments. As shown in FIG. 12A, a mushroom type memory stack 120A is formed on the top electrode 118 of the MESFET type memory access device 150. It should be appreciated that a mushroom type memory stack refers to the idea that the critical dimension (CD) (e.g., width, length or diameter) of the memory stack 120A is larger than the CD of the MESFET type memory access device 150. As also shown in FIG. 12A, a second top electrode 122A is formed on the memory stack 120A. Thus, the combination of the MESFET type memory access device 150 and the memory stack 120A may be 3D stackable (repeatedly formed in a vertical direction). In certain embodiments, the mushroom type memory stack 120A may be a PCM memory device or a RRAM memory device.

Figure 12B:
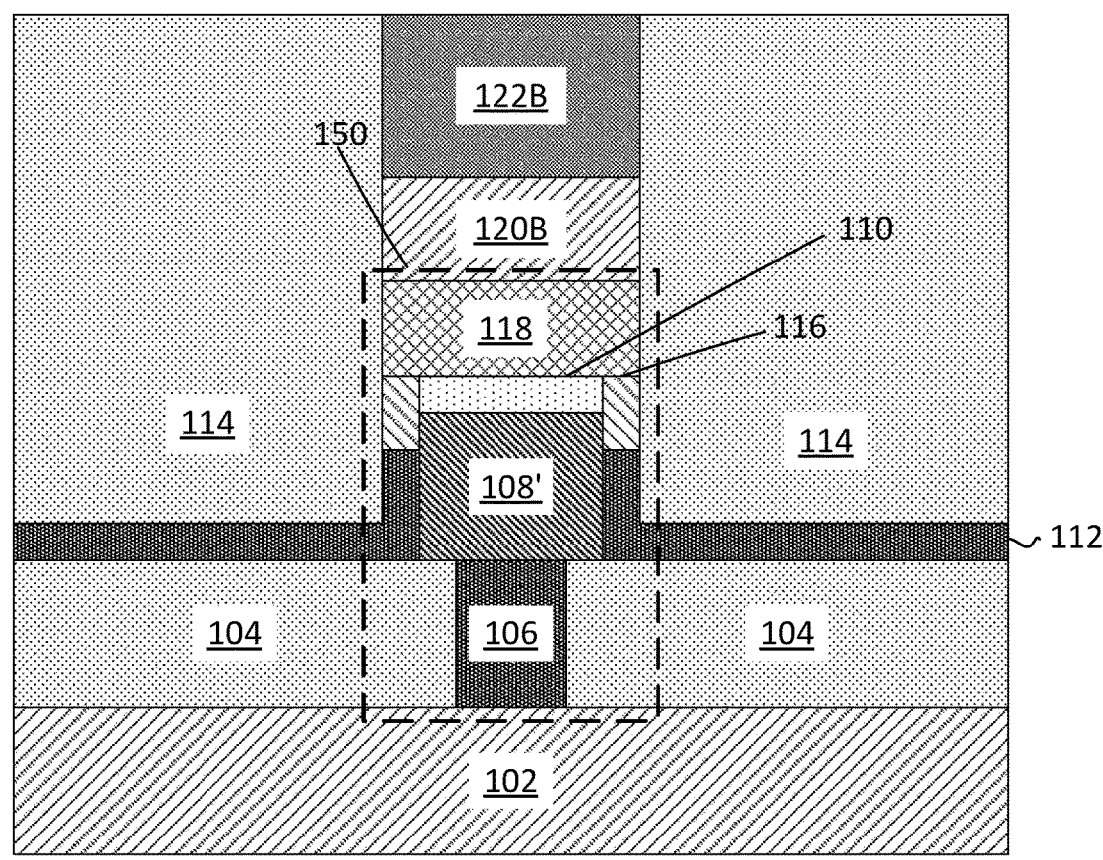
FIG. 12B is a cross-sectional view of the semiconductor device of FIG. 11 in combination with a pillar cell type memory (PCM) device or a resistive random access memory device (RRAM), according to embodiments.

Referring now to FIG. 12B, this figure is a cross-sectional view of the semiconductor device 100 of FIG. 11 in combination with a pillar cell type memory (PCM) device or a resistive random access memory device (RRAM), according to embodiments. As shown in FIG. 12B, a pillar cell type memory stack 120B is formed on the top electrode 118 of the MESFET type memory access device 150. It should be appreciated that a pillar type memory stack refers to the idea that the critical dimension (CD) (e.g., width, length or diameter) of the memory stack 120B is smaller than the CD of the MESFET type memory access device 150. As also shown in FIG. 12B, a second top electrode 122B is formed on the pillar type memory stack 120B. Thus, the combination of the MESFET type memory access device 150 and the pillar type memory stack 120B may be 3D stackable (repeatedly formed in a vertical direction). In certain embodiments, the pillar type memory stack 120B may be a PCM memory device or a RRAM memory device.

Figure 12C:
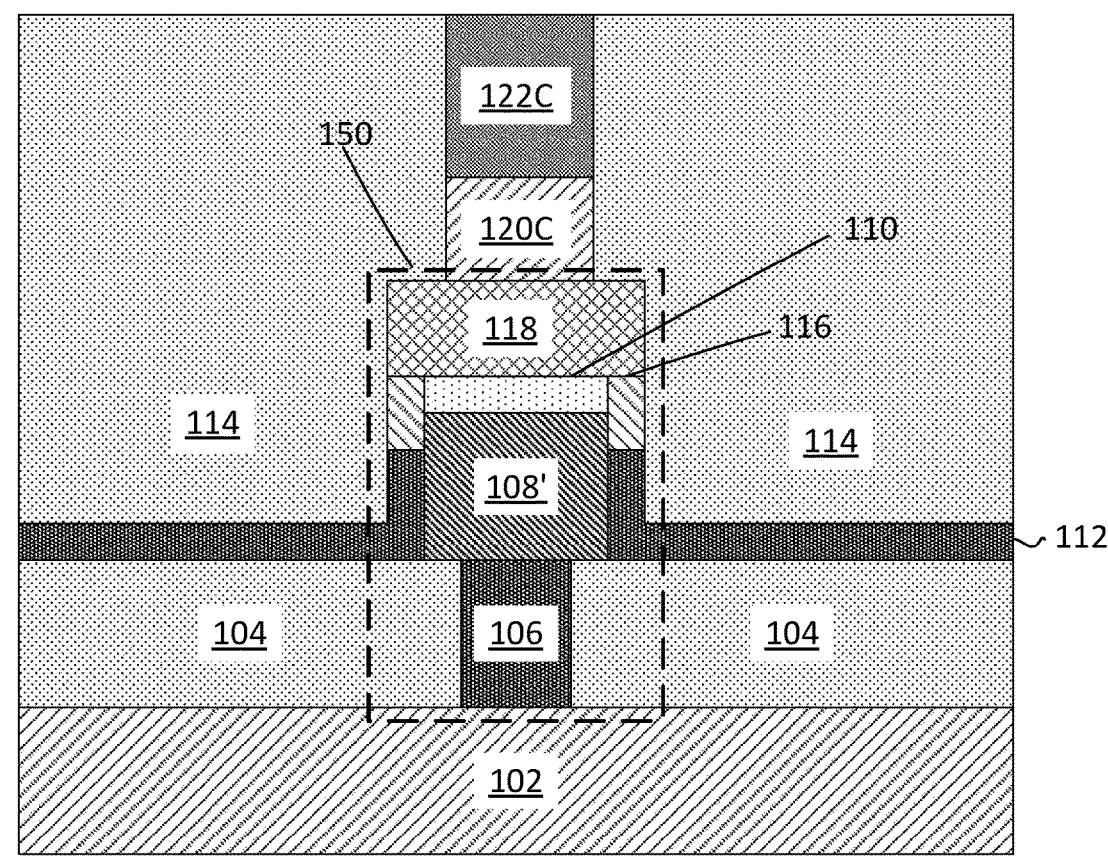
FIG. 12C is a cross-sectional view of the semiconductor device of FIG. 11 in combination with a confined PCM device, according to embodiments.

Referring now to FIG. 12C, this figure is a cross-sectional view of the semiconductor device 100 of FIG. 11 in combination with a confined PCM device, according to embodiments. As shown in FIG. 12C, a confined PCM memory stack 120C is formed on the top electrode 118 of the MESFET type memory access device 150. It should be appreciated that a confined PCM type memory stack refers to the idea that the critical dimension (CD) (e.g., width, length or diameter) of the PCM type memory stack 120C is about equal to the CD of the MESFET type memory access device 150. As also shown in FIG. 12C, a second top electrode 122C is formed on the confined PCM memory stack 120C. Thus, the combination of the MESFET type memory access device 150 and the confined PCM memory stack 120C may be 3D stackable (repeatedly formed in a vertical direction). In certain embodiments, the confined PCM type memory stack 120C may be a PCM memory device.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a vertical metal-semiconductor field-effect transistor (MESFET) device, the method comprising:
   forming a first oxide layer;
   forming a first electrode in the first oxide layer;
   forming a crystallized silicon layer directly contacting the first electrode;
   forming a second electrode on the first oxide layer and on sidewalls of the crystallized silicon layer;
   forming a second oxide layer on upper surfaces of the second electrode; and
   forming a third electrode on an upper surface of the crystallized silicon layer.

2. The method according to claim 1, wherein the first electrode is a source electrode, the second electrode is a gate electrode, and the third electrode is a drain electrode.

3. The method according to claim 1, wherein at least a portion of the second oxide layer is formed between the second electrode and the third electrode.

4. The method according to claim 1, wherein forming the crystallized silicon layer includes laser annealing the crystallized silicon layer.

5. The method according to claim 1, wherein the vertical MESFET device is formed on a BEOL layer of a semiconductor device.

6. The method according to claim 1, wherein a width of the crystallized silicon layer is wider than a width of the first electrode.

7. The method according to claim 1, wherein forming the crystallized silicon layer includes doping with at least one material selected from the group consisting of arsenic (As), antimony (Sb), boron (B), and phosphorus (P).

8. A vertical MESFET device comprising:
   a first oxide layer;
   a first electrode formed in the first oxide layer;
   a crystallized silicon layer directly contacting the first electrode;
   a second electrode formed on the first oxide layer and on sidewalls of the crystallized silicon layer;
   a second oxide layer formed on upper surfaces of the second electrode; and
   a third electrode formed on an upper surface of the crystallized silicon layer.

9. The device according to claim 8, wherein the first electrode is a source electrode, the second electrode is a gate electrode, and the third electrode is a drain electrode.

10. The device according to claim 8, wherein at least a portion of the second oxide layer is formed between the second electrode and the third electrode.

11. The device according to claim 8, wherein forming the crystallized silicon layer includes laser annealing the crystallized silicon layer.

12. The device according to claim 8, wherein the vertical MESFET device is formed on a BEOL layer of a semiconductor device.

13. The device according to claim 8, wherein a width of the crystallized silicon layer is wider than a width of the first electrode.

14. The device according to claim 8, wherein the crystallized silicon layer is doped with at least one material selected from the group consisting of arsenic (As), antimony (Sb), boron (B), and phosphorus (P).

15. A semiconductor device comprising:
   a bidirectional access device that is a vertical MESFET device, the bidirectional access device including
      a first oxide layer,
      a first electrode formed in the first oxide layer,
      a crystallized silicon layer directly contacting the first electrode,
      a second electrode formed on the first oxide layer and on sidewalls of the crystallized silicon layer,
      a second oxide layer formed on upper surfaces of the second electrode, and
      a third electrode formed on an upper surface of the crystallized silicon layer; and
   a memory device connected to the bidirectional access device.

16. The semiconductor device according to claim 15, wherein the memory device is phase change memory (PCM) device.

17. The semiconductor device according to claim 15, wherein the memory device is a resistive random access memory (RRAM) device.

18. The semiconductor device according to claim 15, further comprising a plurality of vertical MESFET devices and memory devices three-dimensionally stacked in a vertical direction of the semiconductor device.

19. The semiconductor device according to claim 15, wherein a width of the crystallized silicon layer is wider than a width of the first electrode.

* * * * *